(12) United States Patent
Keum

(10) Patent No.: US 7,446,008 B2
(45) Date of Patent: Nov. 4, 2008

(54) METHOD FOR FABRICATING SILICIDE LAYERS FOR SEMICONDUCTOR DEVICE

(75) Inventor: Dong Yeal Keum, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/770,193

(22) Filed: Jun. 28, 2007

(65) Prior Publication Data

US 2008/0003835 A1    Jan. 3, 2008

(30) Foreign Application Priority Data

Jun. 28, 2006    (KR) ...................... 10-2006-0058554

(51) Int. Cl.
*H01L 21/336*    (2006.01)
(52) U.S. Cl. ...................... 438/306; 438/533; 438/664; 438/682; 257/E21.432; 257/E21.438

(58) Field of Classification Search ................. 438/233, 438/306, 533, 664, 682, 683, FOR. 204, FOR. 196; 257/E21.432, E21.438
See application file for complete search history.

(56) References Cited

U.S. PATENT DOCUMENTS

| 6,670,228 B2 * | 12/2003 | Coolbaugh et al. | 438/202 |
| 2002/0034847 A1 * | 3/2002 | Wang | 438/201 |
| 2008/0102583 A1 * | 5/2008 | Pritchard et al. | 438/270 |

* cited by examiner

*Primary Examiner*—George Fourson
(74) *Attorney, Agent, or Firm*—Saliwanchik, Lloyd & Saliwanchik

(57) ABSTRACT

Disclosed is a method for fabricating a semiconductor device. The method can include forming a first barrier pattern to cover a first region of a semiconductor substrate while exposing second and third regions of the semiconductor substrate, forming a first oxide layer pattern on the second and third regions, forming a second barrier pattern to cover the third region while exposing the first and second regions, forming a second oxide layer pattern on the first and second regions, forming a third oxide layer pattern on the second region by removing the second and first oxide layer patterns formed on the first and third regions, forming a silicide metal layer on the first, second, and third regions, and selectively forming silicide on the first and third regions by performing an annealing process with respect to the silicide metal layer.

16 Claims, 5 Drawing Sheets

METHOD FOR FABRICATING SILICIDE LAYERS FOR SEMICONDUCTOR DEVICE

CROSS-REFERENCE TO RELATED APPLICATION

The present application claims the benefit under 35 U.S.C. § 119 of Korean Patent Application No. 10-2006-0058554, filed Jun. 28, 2006, which is hereby incorporated by reference in its entirety.

BACKGROUND

A silicide process is generally performed with respect to a part requiring relatively lower contact resistance in a semiconductor device manufactured through a semiconductor manufacturing process.

In contrast, a non-silicide area, in which silicide is not formed, is required in a part requiring relatively higher resistance in the semiconductor device manufactured through the semiconductor manufacturing process.

FIGS. 1 to 3 are sectional views showing the manufacturing process of a related semiconductor device.

As shown in FIG. 1, an oxide layer 110 is formed on a semiconductor substrate 100 in order to manufacture the semiconductor device. The oxide layer 110 prevents silicide from being formed on the semiconductor substrate 100.

As shown in FIG. 2, after the oxide layer 110 is formed on the semiconductor substrate 100, a photoresist pattern 120 is formed on the oxide layer 110 through a photo process.

After the photoresist pattern 120 is formed, a dry etching process is performed with respect to the oxide layer 110 using the photoresist pattern 120 as an etching mask, thereby forming an oxide layer pattern 115.

After the oxide layer pattern 115 is formed, the photoresist pattern 120 disposed on the oxide layer pattern 115 is removed from the oxide layer pattern 115 through a strip process and/or an ashing process.

In FIG. 2, a part of the substrate 100 corresponding to the oxide layer pattern 115 is defined as a non-silicide area in which silicide is not formed, and a part of the substrate 100, in which the oxide layer pattern 115 is not formed, is defined as a silicide area in which silicide is formed.

As shown in FIG. 3, a metal layer (not shown) such as titanium (Ti), cobalt (Co), or nickel (Ni) is formed on the entire surface of the semiconductor substrate 100 including the silicide area and the non-silicide area, and then an annealing process is performed with respect to the resultant structure.

Silicon of the semiconductor substrate 100 reacts with metal of the metal layer in the silicide area through the annealing process, thereby forming silicide 140. In contrast, silicide is not formed on the non-silicide area due to the oxide layer pattern 115.

As shown in FIGS. 1 to 3, in order to form silicide on the semiconductor device, the related semiconductor manufacturing process includes a photolithography process to form the oxide layer pattern and a process of removing the photoresist pattern.

In addition, when the silicide is formed on the semiconductor device through the related semiconductor manufacturing process, the electrical characteristic of the semiconductor device, for example, the electrical characteristic of a transistor may be changed due to plasma charging derived from the dry etching.

BRIEF SUMMARY

An embodiment of the present invention provides a method for fabricating a semiconductor device, capable of shortening the manufacturing process by forming a non-silicide area in the process of manufacturing the semiconductor device using a natural oxide layer.

In an embodiment, a method for fabricating a semiconductor device can include forming a first barrier pattern to cover a first region of a semiconductor substrate while exposing second and third regions of the semiconductor substrate, forming a first oxide layer pattern on the second and third regions, forming a second barrier pattern to cover the third region while exposing the first and second regions, forming a second oxide layer pattern on the first and second regions, forming a third oxide layer pattern on the second region by removing the second and first oxide layer patterns formed on the first and third regions, forming a silicide metal layer on the first, second, and third regions, and selectively forming silicide on the first and third regions by performing an annealing process with respect to the silicide metal layer.

In an embodiment, a method for fabricating a semiconductor device can include forming a first barrier pattern covering a first region of a semiconductor substrate, implanting first impurities onto second and third regions of the semiconductor substrate, selectively forming a first oxide layer on the second region and the third region, forming a second barrier pattern covering the third region, implanting second impurities into the first and second regions, selectively forming a second oxide layer on the first region and the second region, forming a third oxide layer pattern on the second region by selectively removing the second and first oxide layers formed on the first and third regions, and forming silicide on the first and third regions.

DETAILED DESCRIPTION

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

FIGS. 4 to 7 are cross-sectional views showing a method for fabricating a semiconductor device according to an embodiment.

Figure 1:
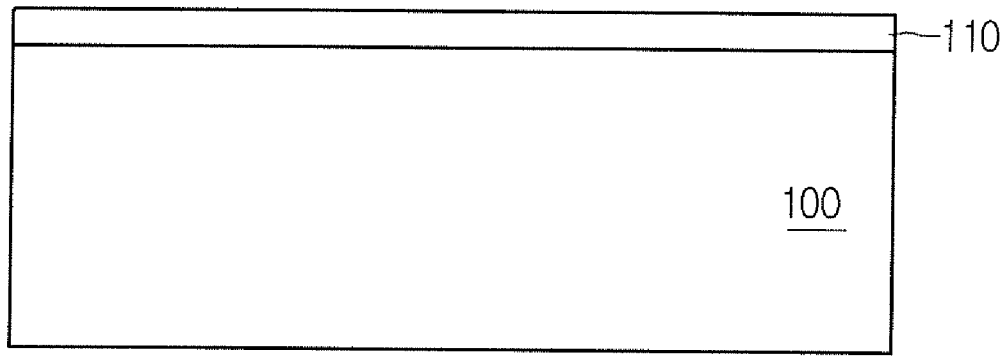
FIGS. 1 to 3 are cross-sectional views showing a manufacturing process of a related semiconductor device.
Figure 2:
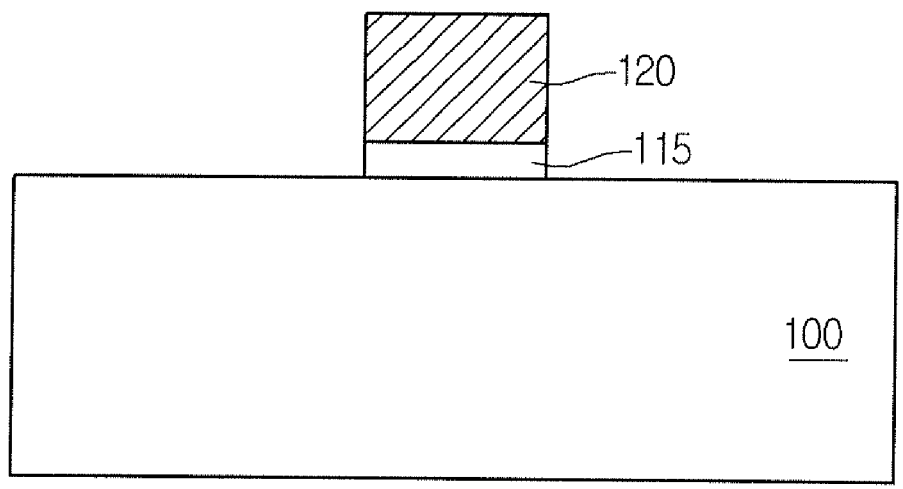
Figure 3:
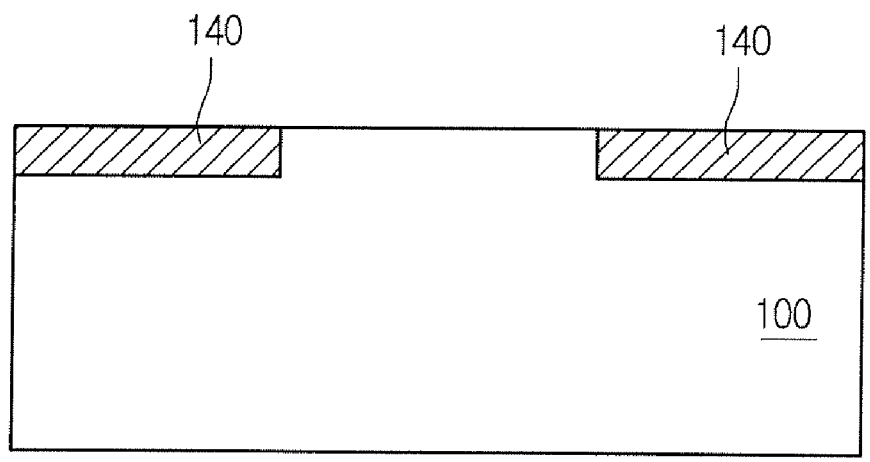
Figure 4:
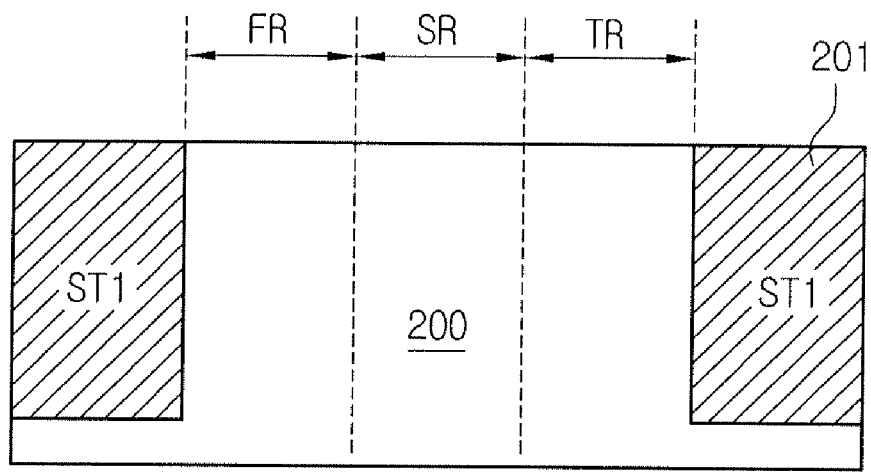
FIGS. 4 to 7 are cross-sectional views showing a method for fabricating a semiconductor device according to an embodiment.

Referring to FIG. 4, shallow trench isolation (STI) layers 201 can be formed on a semiconductor substrate 200 to isolate a plurality of semiconductor devices from each other.

In an embodiment, three regions can be formed in an area between the shallow trench isolation layers 201 on the semiconductor substrate 200.

Hereinafter, the three regions are referred to as a first region (FR), a second region (SR), and a third region (TR), respectively. The second region (SR) is disposed between the first region (FR) and the third region (TR). The first, second, and third regions FR, SR, and TR may be the same size or different sizes.

Figure 5:
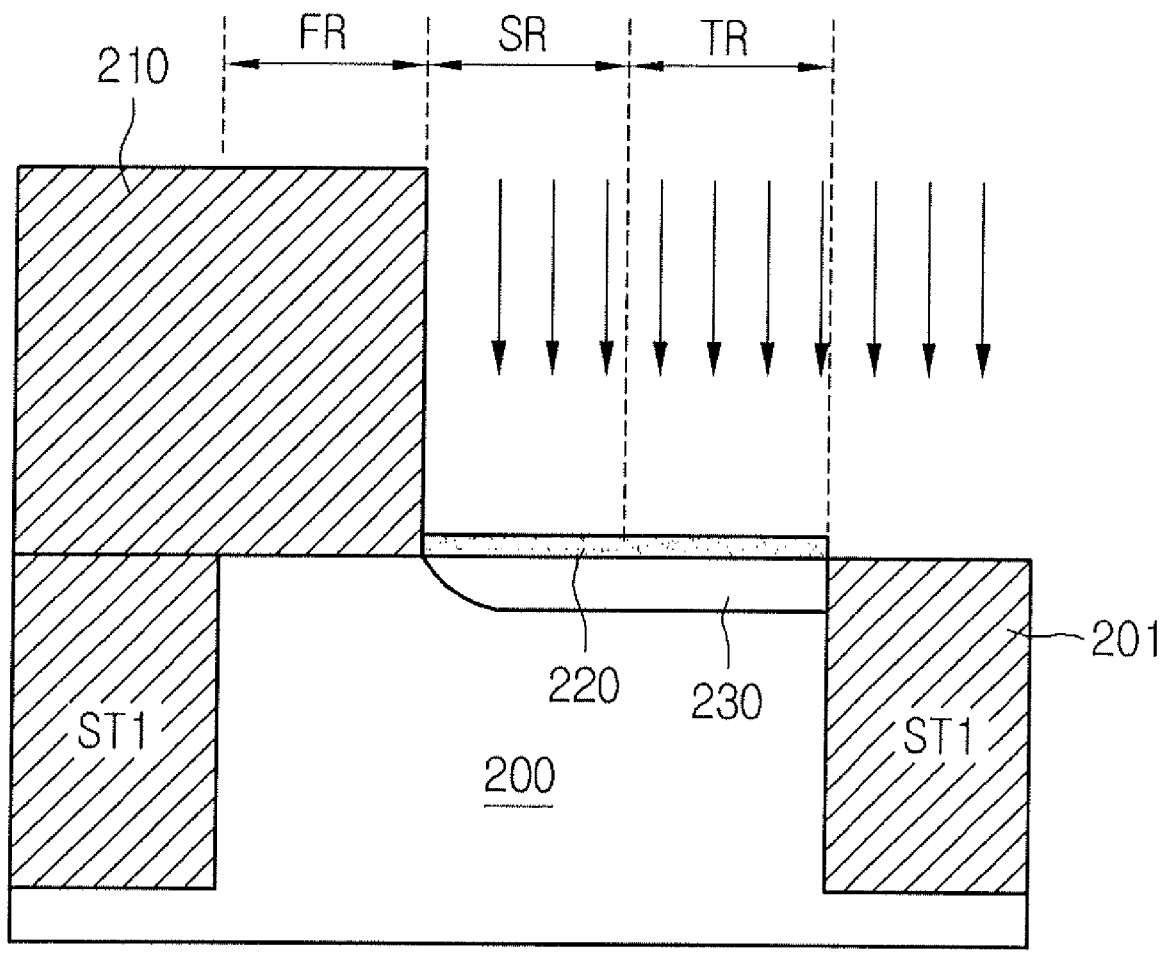

Referring to FIG. 5, a first barrier pattern 210 can be formed on the semiconductor substrate 200. In order to form the first barrier pattern 210, a barrier layer (not shown) for patterning is formed on the entire surface of the semiconductor substrate 200. In an embodiment, the barrier layer can be a photoresist film including a photoresist material.

After the barrier layer is formed on the semiconductor substrate 200, the barrier layer can be patterned through a photo process including an exposure and development process, thereby forming the first barrier pattern 210 on the semiconductor substrate 200, which covers the first region (FR), and exposes the second and third regions (SR and TR).

After the first barrier pattern 210 is formed, a first oxide layer pattern 220 can be formed on the second and third regions (SR and TR) exposed by the first barrier pattern 210. In an embodiment, the first oxide layer pattern 220 includes a natural oxide layer, and is formed on the second region SR and the third region TR using the first barrier pattern 210 as a mask. The first oxide layer pattern 220 has a first thickness measured from the surface of the semiconductor substrate 200.

After or before the first oxide layer pattern 220 is formed, first impurities may be implanted onto the second region (SR) and the third region (TR) of the semiconductor substrate 200 using the first barrier pattern 210 as an ion implantation mask. In an embodiment, the first impurities can be N-type impurities or P-type impurities.

In one embodiment, the first impurities are N-type impurities, and the second region SR and the third region TR, onto which the first impurities are implanted, may serve as source/drain regions 230 of an n-channel metal-oxide semiconductor (NMOS).

After the first oxide layer pattern 220 is formed on the second region SR and the third region TR, or after the first impurities are implanted onto the second region SR and the third region TR using the first barrier pattern 210 as the implantation mask, the first barrier pattern 210 is removed from the semiconductor substrate 200. In an embodiment, the first barrier pattern 210 is removed through a strip process and/or an ashing process.

Figure 6:
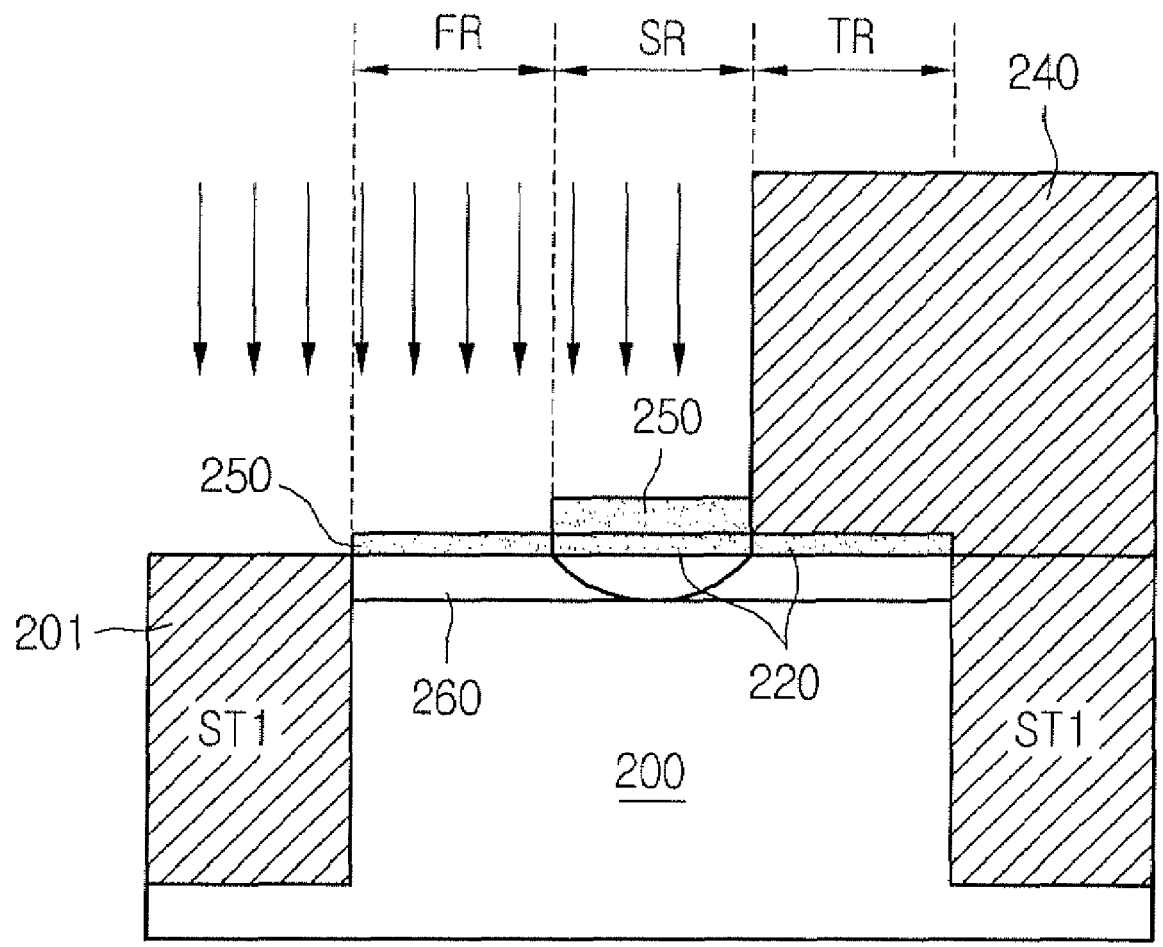

Referring to FIG. 6, after the first barrier pattern 210 is removed from the semiconductor substrate 200, a second barrier pattern 240 can be formed to expose the first and second regions FR and SR while covering the third region TR.

In order to form the second barrier pattern 240, a barrier layer (not shown) for patterning can be formed on the entire surface of the semiconductor substrate 200. In an embodiment, the barrier layer can be a photoresist film including a photoresist material. Since the first oxide layer pattern 220 has been already formed on the third region TR, the second barrier pattern 240 is formed on the first oxide layer pattern 220 of the third region TR.

After the barrier layer is formed on the semiconductor substrate 200, the barrier layer can be patterned through a photo process including an exposure and development process, thereby forming the second barrier pattern 240 on the semiconductor substrate 200 to expose the first region FR and the second region SR while covering the third region TR.

After the second barrier pattern 240 is formed on the third region TR of the semiconductor substrate 200, a second oxide layer pattern 250 can be formed on the first region FR and the second region SR exposed by the second barrier pattern 240. In an embodiment, the second oxide layer pattern 250 formed on the first and second regions FR and SR is a natural oxide layer. The second oxide layer pattern 250 may be formed on the first region FR and the second region SR using the second barrier pattern 240 as a mask. Since the first oxide layer pattern 220 has been already formed on the second region SR, the second oxide layer pattern 250 formed on the second region SR has a second thickness thicker than the first thickness. In an embodiment, the second thickness may be two times the first thickness. In one embodiment the second thickness may be at least two times the first thickness.

Meanwhile, the second oxide layer pattern 250 formed on the first region FR has a third thickness. In an embodiment, the third thickness is substantially equal to the first thickness.

In a further embodiment, after or before forming the second oxide layer pattern 250, second impurities may be implanted onto the first and second regions FR and SR of the semiconductor substrate 200 using the second barrier pattern 240 as an implantation mask. In an embodiment, the second impurities can be N-type impurities or P-type impurities.

In one embodiment, the second impurities are the P-type impurities, and the first and second regions FR and SR, onto which the second impurities are implanted, may serve as source/drain regions 260 of a p-channel metal-oxide semiconductor (PMOS).

After the second oxide layer pattern 250 is formed on the first region FR and the second region SR using the second barrier pattern 240 as the implantation mask, or after the second impurities are implanted onto the first region FR and the second region SR using the second barrier pattern 240 as the implantation mask, the second barrier pattern 240 is removed from the semiconductor substrate 200. The second barrier pattern 240 can be removed through a strip process and/or an ashing process.

Figure 7:
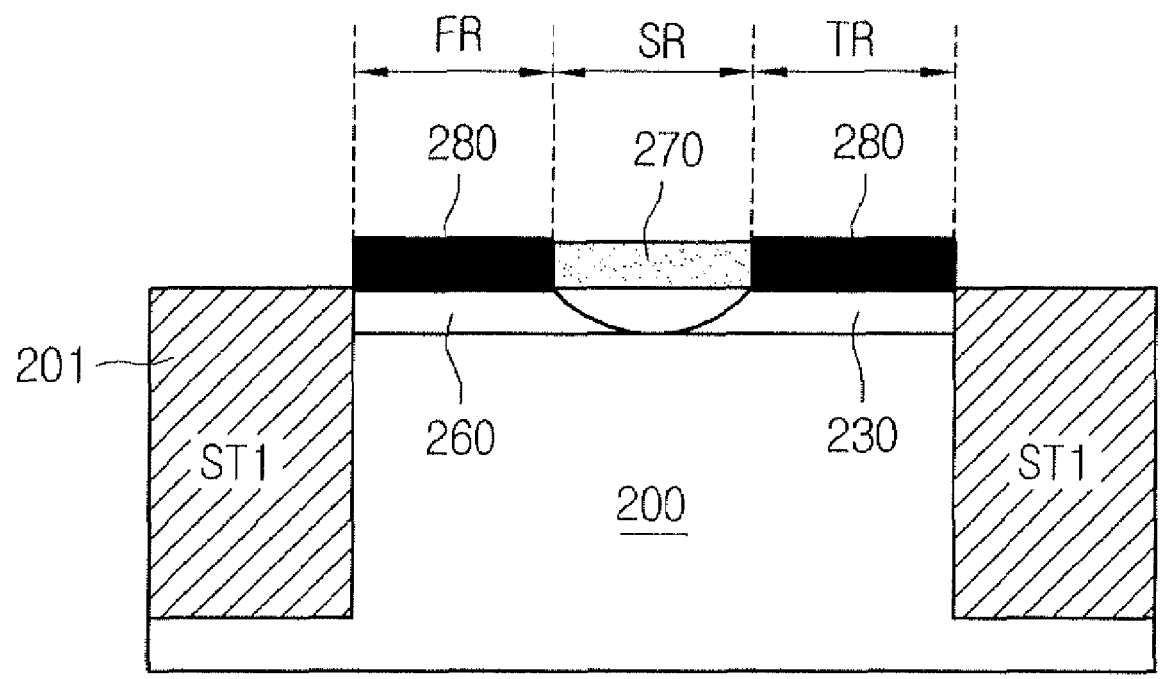

Referring to FIG. 7, a cleaning process can be performed with respect to the semiconductor substrate 200, from which the second barrier pattern 240 is removed. Then a silicide process is formed with the resultant structure. According to an embodiment, silicide is formed on the first region FR and the third region TR, but not the second region SR. In other words, the first and third regions FR and TR are defined as silicide areas, and the second region SR is defined as a non-silicide area.

In order to form the silicides in the silicide areas including the first and third regions FR and TR, the second oxide layer pattern 250 formed on the first region FR and the first oxide layer pattern 220 formed on the third region TR are removed from the semiconductor substrate 200. In an embodiment, the second oxide layer pattern 250 formed on the first region FR and the first oxide layer pattern 220 formed on the third region TR can be removed through a dry etching process, a wet etching process, or a cleaning process used to selectively remove natural oxide layers.

The second oxide layer pattern 250 on the first region FR, and the first oxide layer pattern 220 on the third region TR can be removed from the semiconductor substrate 200, which leaves a third oxide layer pattern 270 formed on the second region SR.

After the third oxide layer pattern 270 is formed on the semiconductor substrate 200, a metal layer for silicide can be formed on the semiconductor substrate 200. In an embodiment, the metal layer for the silicide can be titanium (Ti), tungsten (W), or nickel (Ni).

After the metal layer for the silicide is formed on the semiconductor substrate 200, the metal layer is subject to heat treatment through an annealing process so that metal of the metal layer reacts with silicon of the semiconductor substrate 200. Accordingly, silicide 280 is formed on the semiconductor substrate 200. The third oxide layer 270 formed on the second region SR blocks the metal layer on the second region SR from making contact with silicon of the semiconductor substrate 200 such that the silicide 280 is not formed on the second region SR. Accordingly, a portion, in which the silicide 280 is not formed, corresponding to the third oxide layer 270 can be used as a resistor having a higher resistance value.

In addition, a method of forming a non-silicide according to an embodiment can be adapted for a gate instead of a semiconductor substrate to form the non-silicide. In an embodiment, the first and second oxide layer patterns 220 and 250 can be removed through a dry etching process.

In addition, the resistance value of the non-silicide region may be variously regulated by adjusting the implantation amount of the first and second impurities or by adjusting the size of the first and second barrier patterns.

As described above, the non-silicide area can be formed while forming the silicide, which may solve a problem shown in the etching process. In addition, the manufacturing process may be simplified, so that the manufacturing costs can be reduced.

Although embodiments has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising:
    forming a first barrier pattern to cover a first region of a semiconductor substrate while exposing a second region and a third region of the semiconductor substrate;
    forming a first oxide layer pattern on the second region and the third region;
    forming a second barrier pattern to cover the third region while exposing the first region and the second region;
    forming a second oxide layer pattern on the first region and the second region;
    removing the second oxide layer pattern formed on the first region and the first oxide layer pattern formed on the third region to form a third oxide layer pattern on the second region;
    forming a silicide metal layer on the first region, second region, and third region; and
    selectively forming silicide on the first region and the third region by performing an annealing process with respect to the silicide metal layer.

2. The method according to claim 1, wherein the first region and the second region are spaced apart from each other, and the third region is interposed between the first and second regions.

3. The method according to claim 1, wherein the first barrier pattern is a photoresist pattern.

4. The method according to claim 1, wherein the second barrier pattern is a photoresist pattern.

5. The method according to claim 1, wherein the first oxide layer pattern and the second oxide layer pattern are formed of natural oxide layers.

6. The method according to claim 1, wherein the first oxide layer pattern and the second oxide layer pattern each have a first thickness, and the third oxide layer pattern has a second thickness thicker than the first thickness.

7. The method according to claim 6, wherein the second thickness is twice the first thickness.

8. The method according to claim 1, wherein removing the second oxide layer pattern formed on the first region and the first oxide layer pattern formed on the third region comprises performing a dry etching process.

9. A method for fabricating a semiconductor device, comprising:
    forming a first barrier pattern covering a first region of a semiconductor substrate;
    implanting first impurities onto a second region and a third region of the semiconductor substrate;
    selectively forming a first oxide layer on the second region and the third region;
    forming a second barrier pattern covering the third region;
    implanting second impurities into the first region and the second region;
    selectively forming a second oxide layer on the first region and the second region;
    selectively removing the second oxide layer formed on the first region and the first oxide layer formed on the third region to form a third oxide layer pattern on the second region; and
    forming silicide on the first region and the third region.

10. The method according to claim 9, wherein the first impurities are N-type impurities, and the second impurities are P-type impurities.

11. The method according to claim 9, wherein selectively removing the second oxide layer formed on the first region and the first oxide layer formed on the third region comprises performing a wet etching process.

12. The method according to claim 9, wherein the first oxide layer and the second oxide layer each have a first thickness, and the third oxide layer pattern has a second thickness thicker than the first thickness.

13. The method according to claim 12, wherein the second thickness is at least twice the first thickness.

14. The method according to claim 9, wherein the second oxide layer pattern overlaps the first oxide layer pattern in the second region.

15. The method according to claim 9, further comprising forming a gate structure on the third oxide layer pattern.

16. The method according to claim 9, wherein forming the silicide comprises:
    forming a silicide metal layer on the semiconductor substrate;
    heat-treating the semiconductor substrate to react silicide metal with silicon of the semiconductor substrate; and
    removing the silicide metal layer disposed on the third oxide layer pattern.

* * * * *